(12) United States Patent
Liang et al.

(10) Patent No.: US 8,736,016 B2
(45) Date of Patent: May 27, 2014

(54) STRAINED ISOLATION REGIONS

(75) Inventors: Mong-Song Liang, Hsin-Chu (TW);
Tze-Liang Lee, Hsin-Chu (TW);
Kuo-Tai Huang, Hsin-Chu (TW);
Chao-Cheng Chen, Hsin-Chu (TW);
Hao-Ming Lien, Hsin-Chu (TW);
Chih-Tang Peng, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 806 days.

(21) Appl. No.: 11/759,791

(22) Filed: Jun. 7, 2007

(65) Prior Publication Data

US 2008/0303102 A1  Dec. 11, 2008

(51) Int. Cl.
*H01L 29/78* (2006.01)

(52) U.S. Cl.
USPC .......................... 257/506; 257/510

(58) Field of Classification Search
USPC ................................. 257/506, 510
See application file for complete search history.

(56) References Cited

U.S. PATENT DOCUMENTS

| | | | | |
|---|---|---|---|---|
| 5,719,085 | A * | 2/1998 | Moon et al. | 438/424 |
| 6,294,823 | B1 * | 9/2001 | Arafa et al. | 257/510 |
| 6,368,931 | B1 | 4/2002 | Kuhn et al. | |
| 6,551,901 | B1 * | 4/2003 | Gu et al. | 438/424 |
| 6,870,179 | B2 * | 3/2005 | Shaheed et al. | 257/29 |
| 7,029,998 | B2 | 4/2006 | Park | |
| 7,262,472 | B2 * | 8/2007 | Pidin | 257/410 |
| 7,355,262 | B2 * | 4/2008 | Ko et al. | 257/506 |
| 7,361,973 | B2 * | 4/2008 | Chidambarrao et al. | 257/623 |
| 2004/0217420 | A1 * | 11/2004 | Yeo et al. | 257/347 |
| 2006/0121688 | A1 | 6/2006 | Ko et al. | |
| 2006/0278952 | A1 * | 12/2006 | Mori et al. | 257/510 |
| 2007/0069307 | A1 * | 3/2007 | Eda | 257/374 |
| 2007/0181966 | A1 * | 8/2007 | Watatani et al. | 257/506 |
| 2008/0237709 | A1 * | 10/2008 | Chidambarrao et al. | 257/347 |

FOREIGN PATENT DOCUMENTS

CN  1797736  7/2006

* cited by examiner

*Primary Examiner* — Eugene Lee
(74) *Attorney, Agent, or Firm* — Slater and Matsil, L.L.P.

(57) ABSTRACT

An isolation trench having localized stressors is provided. In accordance with embodiments of the present invention, a trench is formed in a substrate and partially filled with a dielectric material. In an embodiment, the trench is filled with a dielectric layer and a planarization step is performed to planarize the surface with the surface of the substrate. The dielectric material is then recessed below the surface of the substrate. In the recessed portion of the trench, the dielectric material may remain along the sidewalls or the dielectric material may be removed along the sidewalls. A stress film, either tensile or compressive, may then be formed over the dielectric material within the recessed portion. The stress film may also extend over a transistor or other semiconductor structure.

16 Claims, 8 Drawing Sheets

STRAINED ISOLATION REGIONS

TECHNICAL FIELD

The present invention relates generally to semiconductor devices, and more particularly, to metal-oxide-semiconductor field-effect transistors and methods of manufacture.

BACKGROUND

Size reduction of metal-oxide-semiconductor field-effect transistors (MOSFETs), including reduction of the gate length and gate oxide thickness, has enabled the continued improvement in speed, performance, density, and cost per unit function of integrated circuits over the past few decades. To further enhance transistor performance, MOSFET devices have been fabricated using strained channel regions located in portions of a semiconductor substrate. Strained channel regions allow enhanced carrier mobility to be realized, thereby resulting in increased performance when used for n-channel (NMOSFET) or for p-channel (PMOSFET) devices. Generally, it is desirable to induce a tensile strain in the n-channel of an NMOSFET transistor in the source-to-drain direction to increase electron mobility and to induce a compressive strain in the p-channel of a PMOSFET transistor in the source-to-drain direction to increase hole mobility. There are several existing approaches of introducing strain in the transistor channel region.

In one approach, semiconductor alloy layers, such as silicon-germanium or silicon-germanium-carbon, are formed below an overlying thin semiconductor layer, wherein the semiconductor alloy layer has a different lattice structure than the overlying semiconductor layer. The difference in the lattice structure imparts strain in the overlying semiconductor layer to increase carrier mobility.

This approach, however, can be difficult to process in addition to presenting junction leakage concerns as a result of the blanket semiconductor alloy layer. The epitaxial growth of the semiconductor alloy layer, such as a silicon-germanium layer, can be costly and difficult to accurately control the level of germanium in the epitaxially grown semiconductor alloy layer. In addition, the presence of a blanket semiconductor alloy layer allows an unwanted interface between the source/drain regions to exist, possibly introducing junction leakage.

In another approach, strain in the channel is introduced after the transistor is formed. In this approach, a high-stress film is formed over a completed transistor structure formed in a silicon substrate. The high-stress film or stressor exerts significant influence on the channel, modifying the silicon lattice spacing in the channel region, and thus introducing strain in the channel region. In this case, the stressor is placed above the completed transistor structure. The device performance is obtained by increasing the stress or thickness of the high-stress film.

The amount of stress that may be applied, however, is limited. For example, the amount of stress that may be applied by a high-stress film is limited by, among other things, subsequent gap-fill capabilities and the etching window. Accordingly, there is a need for an efficient and cost-effective method to induce additional strain such that the performance characteristics of transistors are enhanced.

SUMMARY OF THE INVENTION

These and other problems are generally reduced, solved or circumvented, and technical advantages are generally achieved, by embodiments of the present invention, which provides a strained semiconductor device to improve the operating characteristics of the semiconductor device and a method of manufacture.

In an embodiment of the present invention, a semiconductor structure having a strained isolation region is provided. The semiconductor structure includes an isolation trench formed in a substrate such that the isolation trench is at least partially filled with a dielectric material. At least a part of the top surface of the dielectric material is recessed below a top surface of the substrate. The semiconductor structure further comprises a transistor gate formed over the substrate and a contact etch stop layer over the substrate and the dielectric material within the isolation trench. The contact etch stop layer may be a tensile-stress film for use with n-channel devices or a compressive-stress film for use with p-channel devices.

In another embodiment of the present invention, another semiconductor structure having a strained isolation region is provided. The semiconductor structure includes a substrate and a shallow trench isolation formed in the substrate, the shallow trench isolation comprises a trench filled with a dielectric material. The semiconductor structure further includes a recess in the shallow trench isolation and a contact etch stop layer in the recess and on the substrate. The contact etch stop layer may be a tensile-stress film for use with n-channel devices or a compressive-stress film for use with p-channel devices.

In yet another embodiment of the present invention, yet another semiconductor structure having a strained isolation region is provided. The semiconductor structure includes a substrate having an isolation trench formed therein. The isolation trench is at least partially filled with a dielectric material that is recessed below a top surface of the substrate. A transistor is formed on the substrate and a stress layer is formed over the dielectric material and the substrate. The stress layer may be a tensile-stress film for use with n-channel devices or a compressive-stress film for use with p-channel devices.

It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

The object and other advantages of this invention are best described in the preferred embodiment with reference to the attached drawings that include.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
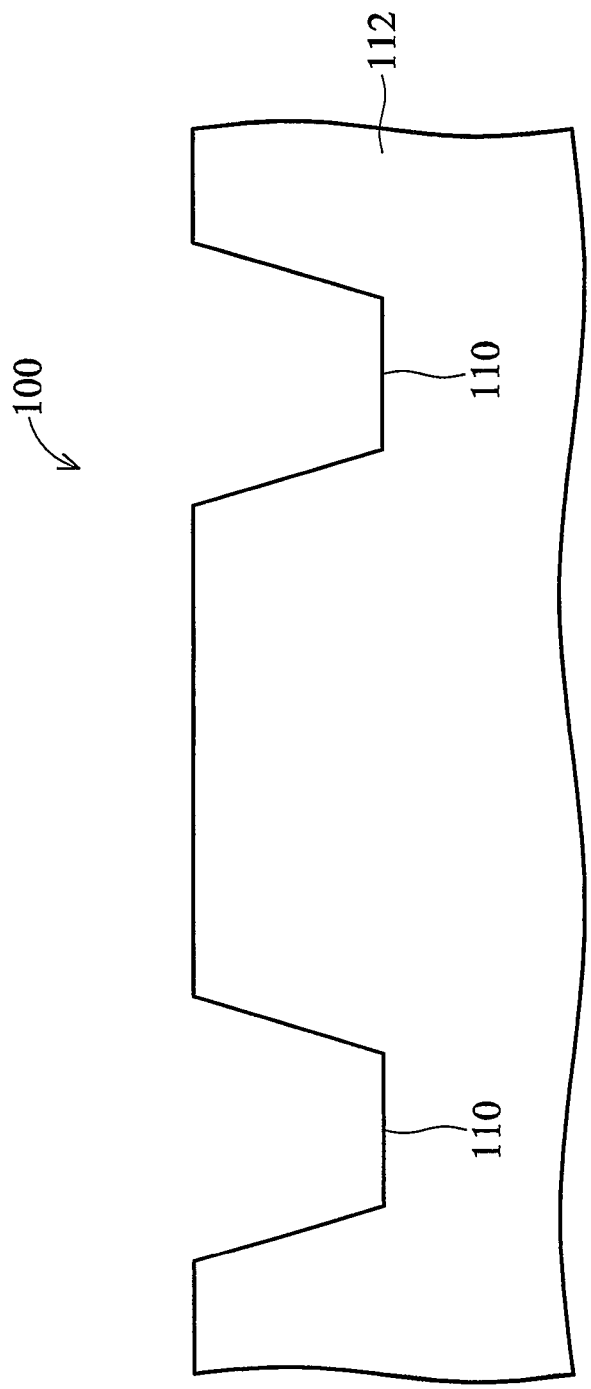
FIGS. 1-5 illustrate various process steps of fabricating a MOSFET device having strained isolation regions in accordance with an embodiment of the present invention.

FIGS. 1-5 illustrate a method embodiment for fabricating a semiconductor device having a strained channel region in accordance with an embodiment of the present invention. Embodiments of the present invention illustrated herein may be used in a variety of circuits. Referring first to FIG. 1, a portion of a wafer 100 is shown comprising isolation trenches 110 formed in a substrate 112. The substrate 112 may comprise bulk silicon, doped or undoped, or an active layer of a semiconductor-on-insulator (SOI) substrate. Generally, an SOI comprises a layer of a semiconductor material, such as silicon, formed on an insulator layer. The insulator layer may be, for example, a buried oxide (BOX) layer or a silicon oxide layer. The insulator layer is provided on a substrate, typically a silicon or glass substrate. Other substrates, such as a multi-layered or gradient substrate may also be used.

The isolation trenches 110 may be formed, for example, by photolithography techniques known in the art. Generally, photolithography involves depositing a photoresist material, which is then masked, exposed, and developed. After the photoresist mask is patterned, an etching process may be performed to remove unwanted portions of the substrate 112 as illustrated in FIG. 1. In the preferred embodiment in which the substrate comprises bulk silicon, the etching process may be a wet or dry, anisotropic or isotropic, etch process, but preferably is an anisotropic dry etch process. In an embodiment the isolation trenches 110 have a depth from about 2000 Å to about 3000 Å.

Figure 2:
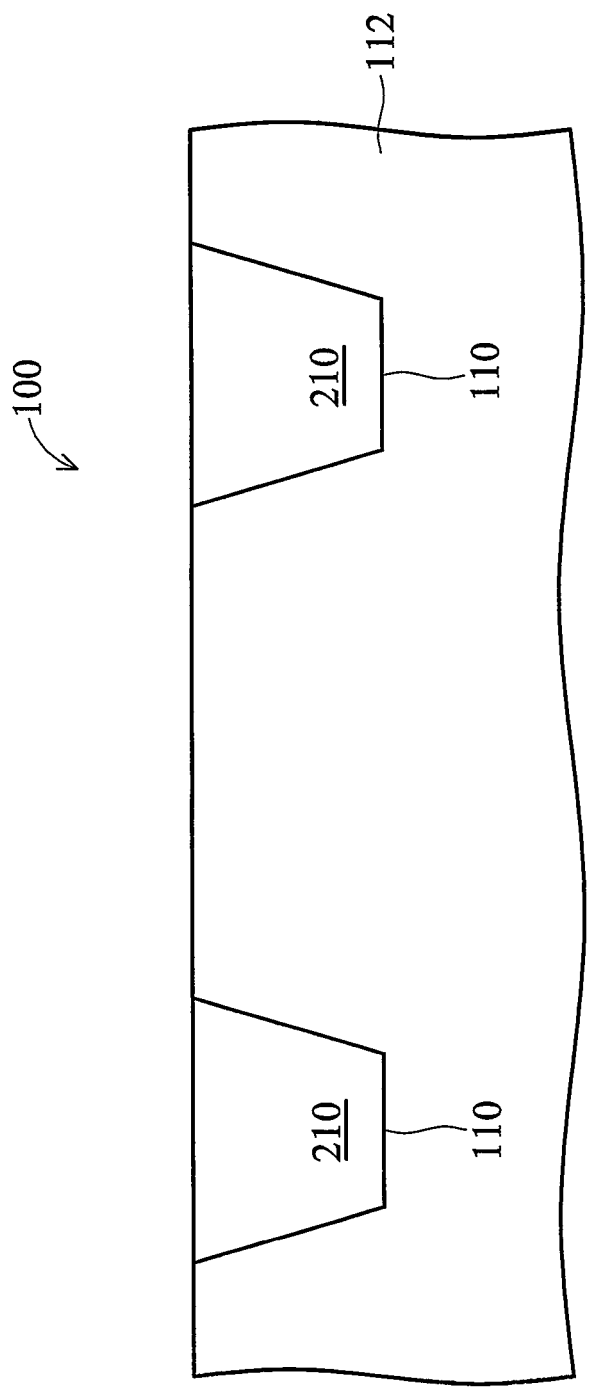

FIG. 2 illustrates the wafer 100 after the isolation trenches 110 have been filled with an isolation material 210 in accordance with an embodiment of the present invention. In an embodiment, the isolation material 210 comprises an oxide layer formed by any oxidation process, such as wet or dry thermal oxidation in an ambient comprising an oxide, $H_2O$, NO, or a combination thereof, or by chemical vapor deposition (CVD) techniques using tetra-ethyl-ortho-silicate (TEOS) and oxygen as a precursor.

Thereafter, a planarization step may be performed to planarize the surface of the isolation material 210 with a top surface of the substrate 112. The planarization step may be accomplished, for example, using a chemical mechanical polishing (CMP) process known and used in the art.

Figure 3:
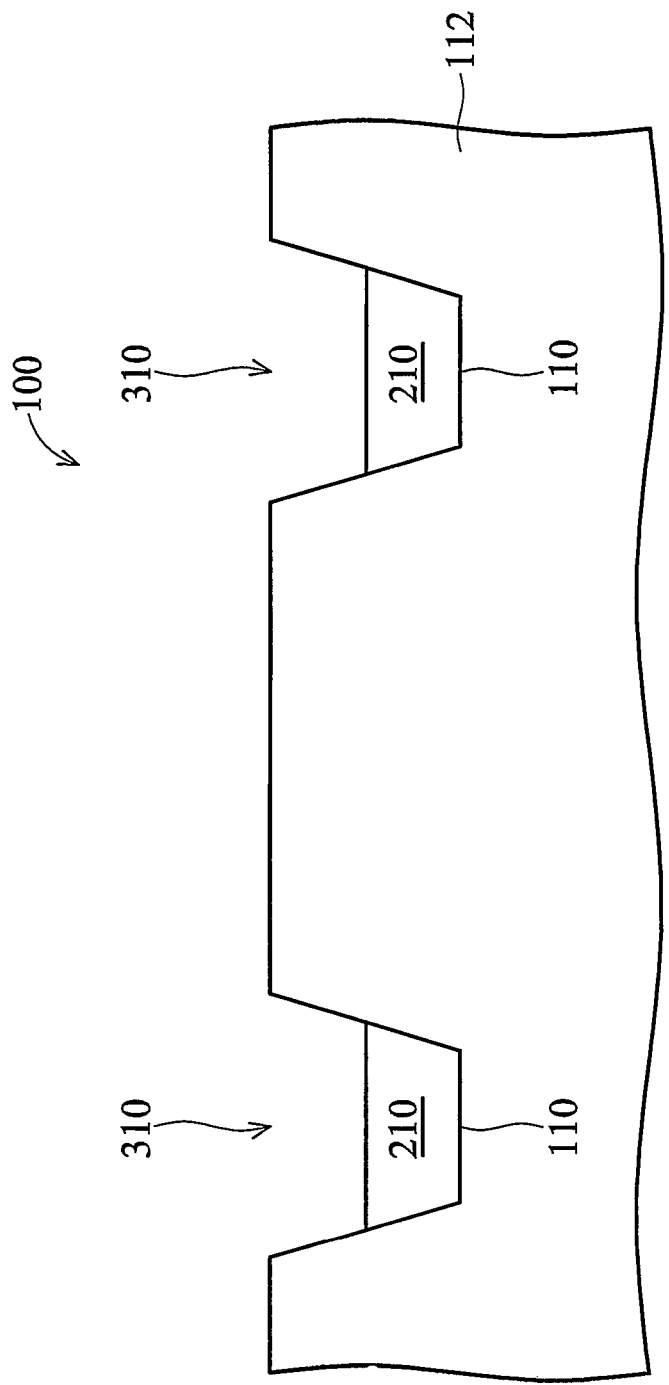

FIG. 3 illustrates the wafer 100 after a recess 310 is formed in the isolation material 210 in accordance with an embodiment of the present invention. The recess 310 may be formed, for example, by performing a timed wet etch process. For example, in an embodiment in which the isolation material 210 is recessed below a top surface of the substrate 112 from about 200 Å to about 500 Å, the isolation material 210 may be recessed by performing a wet etch in a solution of dilute HF for about 150 seconds to about 600 seconds.

Figure 4:
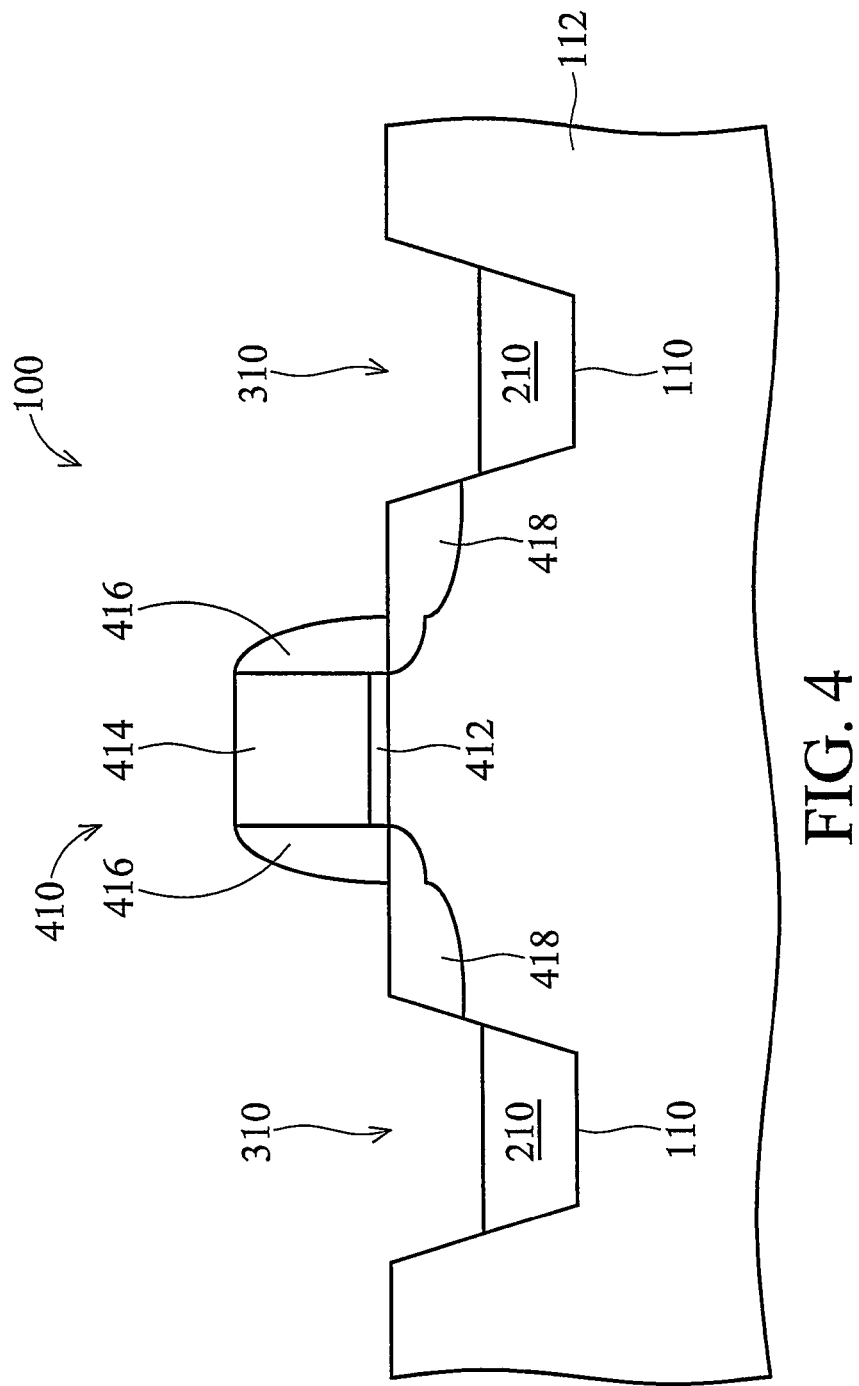

FIG. 4 illustrates formation of a transistor 410 in accordance with an embodiment of the present invention. The transistor 410 includes a gate dielectric 412, a gate electrode 414, spacers 416, and source/drain regions 418. The gate dielectric 412 and the gate electrode 414 are formed and patterned as is known in the art on the substrate 112. The gate dielectric 412 is preferably a high-K dielectric material, such as silicon oxide, silicon oxynitride, silicon nitride, an oxide, a nitrogen-containing oxide, a combination thereof, or the like. Preferably, the gate dielectric 412 has a relative permittivity value greater than about 4. Other examples of such materials include aluminum oxide, lanthanum oxide, hafnium oxide, zirconium oxide, hafnium oxynitride, or combinations thereof.

In the preferred embodiment in which the gate dielectric 412 comprises an oxide layer, the gate dielectric 412 may be formed by any oxidation process, such as wet or dry thermal oxidation in an ambient comprising an oxide, $H_2O$, NO, or a combination thereof, or by CVD techniques using TEOS and oxygen as a precursor. In the preferred embodiment, the gate dielectric 412 is about 8 Å to about 50 Å in thickness, but more preferably about 20 Å in thickness.

The gate electrode 414 preferably comprises a conductive material, such as a metal (e.g., tantalum, titanium, molybdenum, tungsten, platinum, aluminum, hafnium, or ruthenium), a metal silicide (e.g., titanium silicide, cobalt silicide, nickel silicide, or tantalum silicide), a metal nitride (e.g., titanium nitride or tantalum nitride), doped poly-crystalline silicon, other conductive materials, or a combination thereof. In one example, amorphous silicon is deposited and recrystallized to create poly-crystalline silicon (poly-silicon). In the preferred embodiment in which the gate electrode is poly-silicon, the gate electrode 414 may be formed by depositing doped or undoped poly-silicon by low-pressure chemical vapor deposition (LPCVD) to a thickness in the range of about 400 Å to about 2500 Å, but more preferably about 800 Å.

The gate dielectric 412 and the gate electrode 414 may be patterned by photolithography techniques as are known in the art. Generally, photolithography involves depositing a photoresist material, which is then masked, exposed, and developed. After the photoresist mask is patterned, an etching process may be performed to remove unwanted portions of the gate dielectric material and the gate electrode material to form the gate dielectric 412 and the gate electrode 414 as illustrated in FIG. 4. In the preferred embodiment in which the gate electrode material is poly-crystalline silicon and the gate dielectric material is an oxide, the etching process may be a wet or dry, anisotropic or isotropic, etch process, but preferably is an anisotropic dry etch process.

Source/drain regions 418 may be formed by ion implantation. The source/drain regions 418 may be implanted with an n-type dopant, such as phosphorous, nitrogen, arsenic, antimony, or the like, to fabricate NMOS devices or may be implanted with a p-type dopant, such as boron, aluminum, indium, or the like, to fabricate PMOS devices. Optionally, NMOS devices may be fabricated on the same chip as PMOS devices. In this optional embodiment, it may be necessary to utilize multiple masking and ion implant steps as are known in the art such that only specific areas are implanted with n-type and/or p-type ions.

Spacers 416, which form spacers for a second ion implant in the source/drain regions 418, preferably comprise silicon nitride ($Si_3N_4$), or a nitrogen containing layer other than $Si_3N_4$, such as $Si_xN_y$, silicon oxynitride $SiO_xN_y$, silicon oxime $SiO_xN_y:H_z$, or a combination thereof. In a preferred embodiment, the spacers 416 are formed from a layer comprising $Si_3N_4$ that has been formed using CVD techniques using silane and ammonia as precursor gases.

The spacers 416 may be patterned by performing an isotropic or anisotropic etch process, such as an isotropic etch process using a solution of phosphoric acid ($H_3PO_4$). Because the thickness of the layer of $Si_3N_4$ is greater in the regions adjacent to the gate electrode 414, the isotropic etch removes the $Si_3N_4$ material on top of the gate electrode 414 and the areas of substrate 112 not immediately adjacent to the gate electrode 414, leaving the spacer 416 as illustrated in FIG. 4.

It should be noted that a silicidation process may be performed. The silicidation process may be used to improve the conductivity of conductive gate electrode 414, as well as to decrease source/drain regions 418 resistance. The silicide may be formed by depositing a metal layer such as titanium, nickel, tungsten, or cobalt via plasma vapor deposition (PVD) procedures. An anneal procedure causes the metal layer to react with conductive gate electrode 414 and the source/drain regions 418 to form metal silicide. Portions of the metal layer overlying insulator spacers 416 remain unreacted. Selective removal of the unreacted portions of the metal layer may be accomplished, for example, via wet etch procedures. An additional anneal cycle may be used if desired to alter the phase of silicide regions, which may result in a lower resistance.

It should also be noted that the above description is but one example of a transistor 410 that may be used with an embodiment of the present invention. Other transistors and other semiconductor devices may also be used. For example, the transistor may have raised source/drains, the transistor may be a split-gate transistor or a FinFET design, different materials and thicknesses may be used, liners may be used between the spacer and the gate electrode, multiple spacers may be used, various different doping profiles may be used, or the like.

Figure 5:
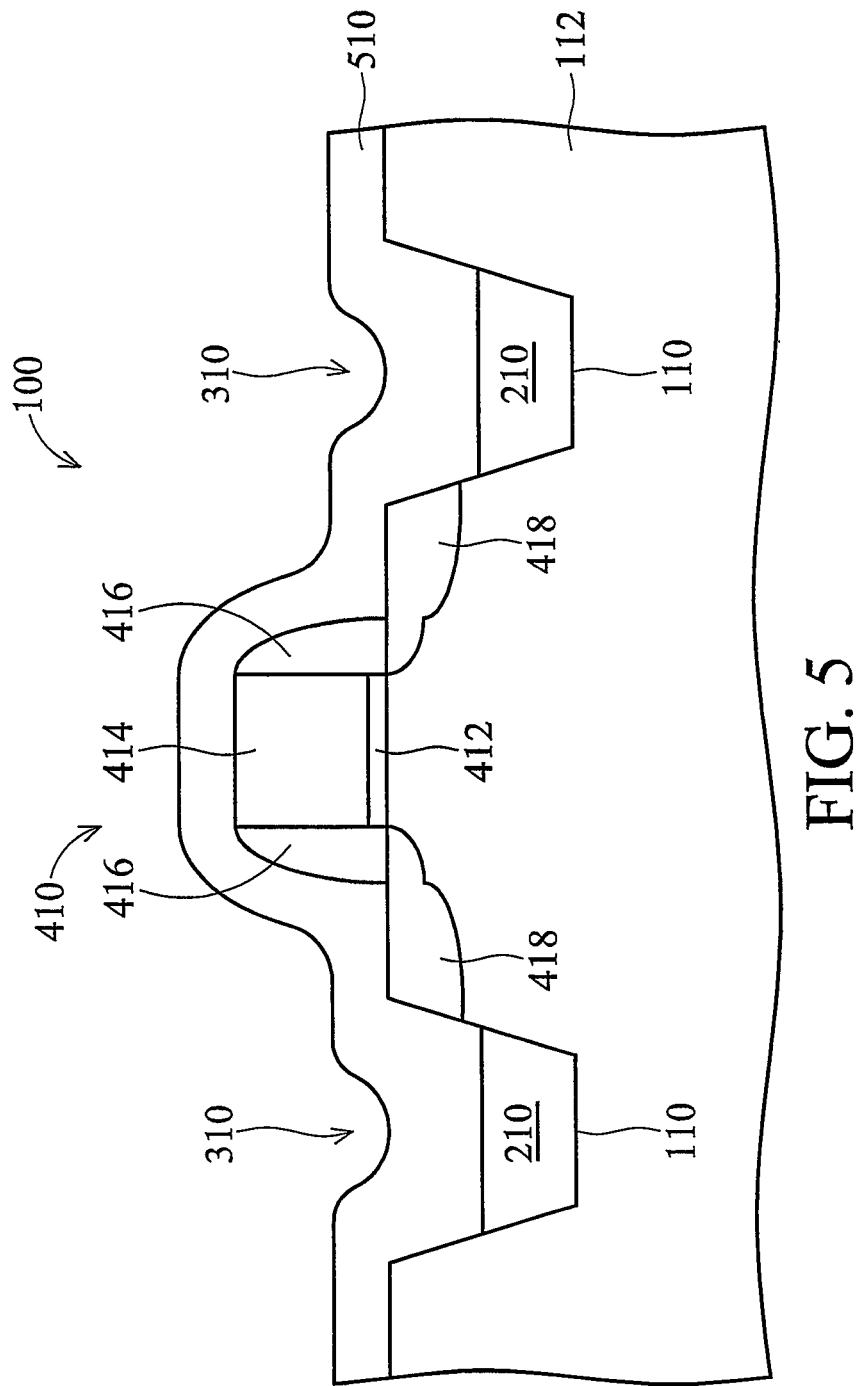

FIG. 5 illustrates the wafer 100 after a high-stress film 510 has been formed thereon, covering the transistor 410 and the recess 310 of the isolation trenches 110 in accordance with an embodiment of the present invention. It should be noted that the high-stress film 510 may be either a tensile-stress film or a compressive-stress film. A tensile-stress film results in tensile strain in the channel region and enhances electron mobility of an n-channel transistor, and a compressive-stress film results in compressive strain in the channel region and enhances hole mobility of a p-channel transistor.

The high-stress film 510 may be formed, for example, by a CVD process, a PVD process, an atomic layer deposition (ALD) process, or the like. Preferably, a tensile-stress film has a thickness from about 5 nm to about 500 nm and exerts a tensile stress in the range of about 0 GPa to about 5 GPa substantially along the source-to-drain direction. A compressive-stress film preferably has a thickness from about 5 nm to about 500 nm and exerts a compressive stress in the range of about 0 GPa to about −5 GPa. Materials that may be suitable for use as a tensile-stress film include SiN, oxide, oxynitride, SiC, SiCN, Ni silicide, Co silicide, combinations thereof, and the like. Materials that may be suitable for use as a compressive-stress film include SiGe, SiGeN, nitride, oxide, oxynitride, combinations thereof, and the like.

It should be noted that the high-stress film 510 may comprise a plurality of layers of either the same or different materials having the same or different stress characteristics. Furthermore, it should be noted that embodiments of the present invention may be used to fabricate wafers having both NMOS and PMOS devices thereon. For example, high-stress films may be formed and patterned individually by known deposition and patterning techniques to create NMOS transistors having a tensile-stress film and PMOS transistors having a compressive-stress film on the same wafer. This allows each transistor to be independently customized for its particular function.

Thereafter, standard processes may be used to complete fabrication and packaging of the semiconductor device. For example, an optional contact-etch stop layer may be formed, inter-layer dielectrics and metal layers may be formed and patterned, other circuitry may be formed, the wafer may be diced and packaged, and the like.

Figure 6:
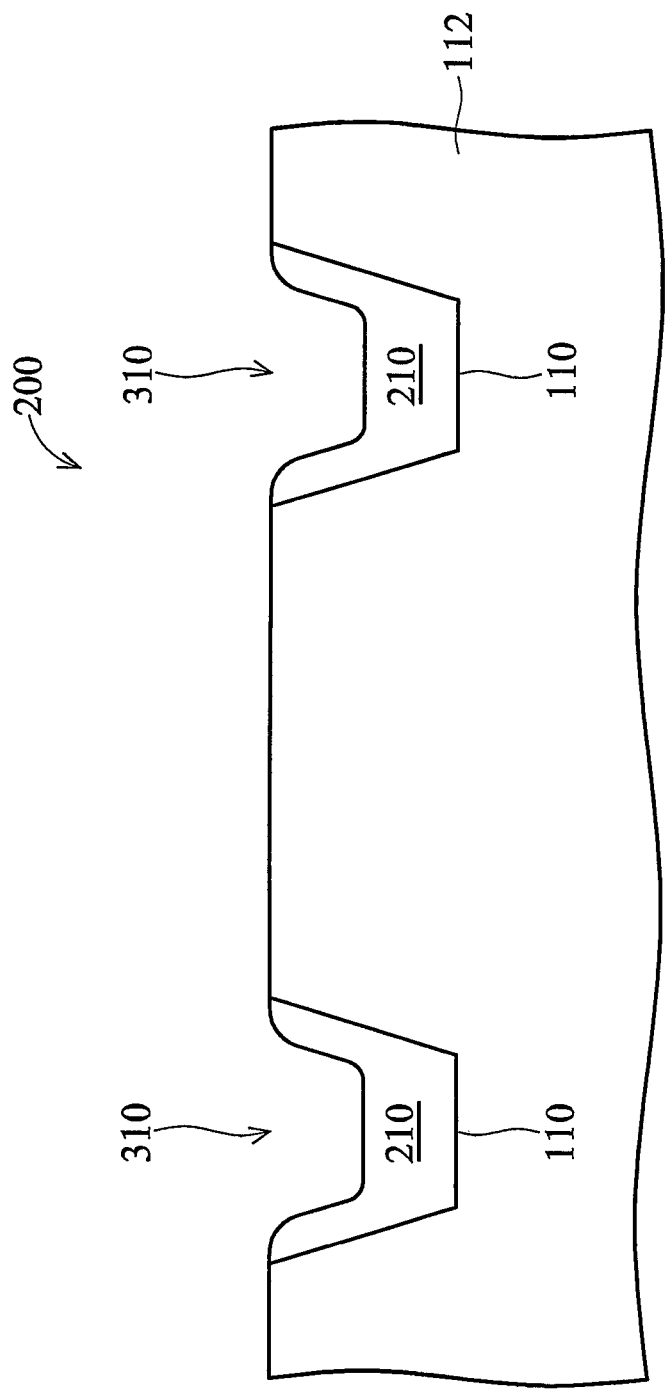
FIGS. 6-8 illustrate various process steps of fabricating a MOSFET device having strained isolation regions in accordance with another embodiment of the present invention.
Figure 7:
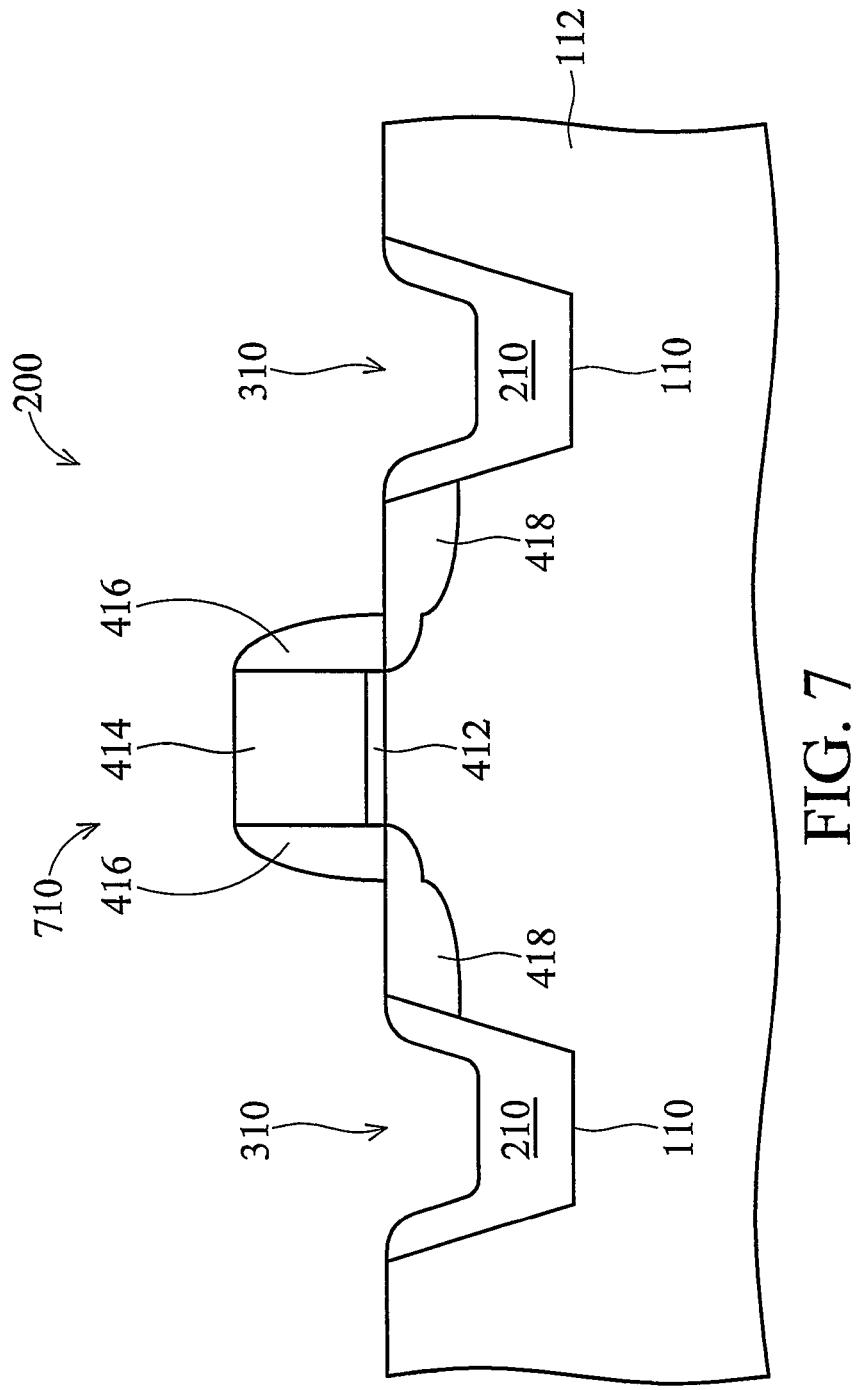
Figure 8:
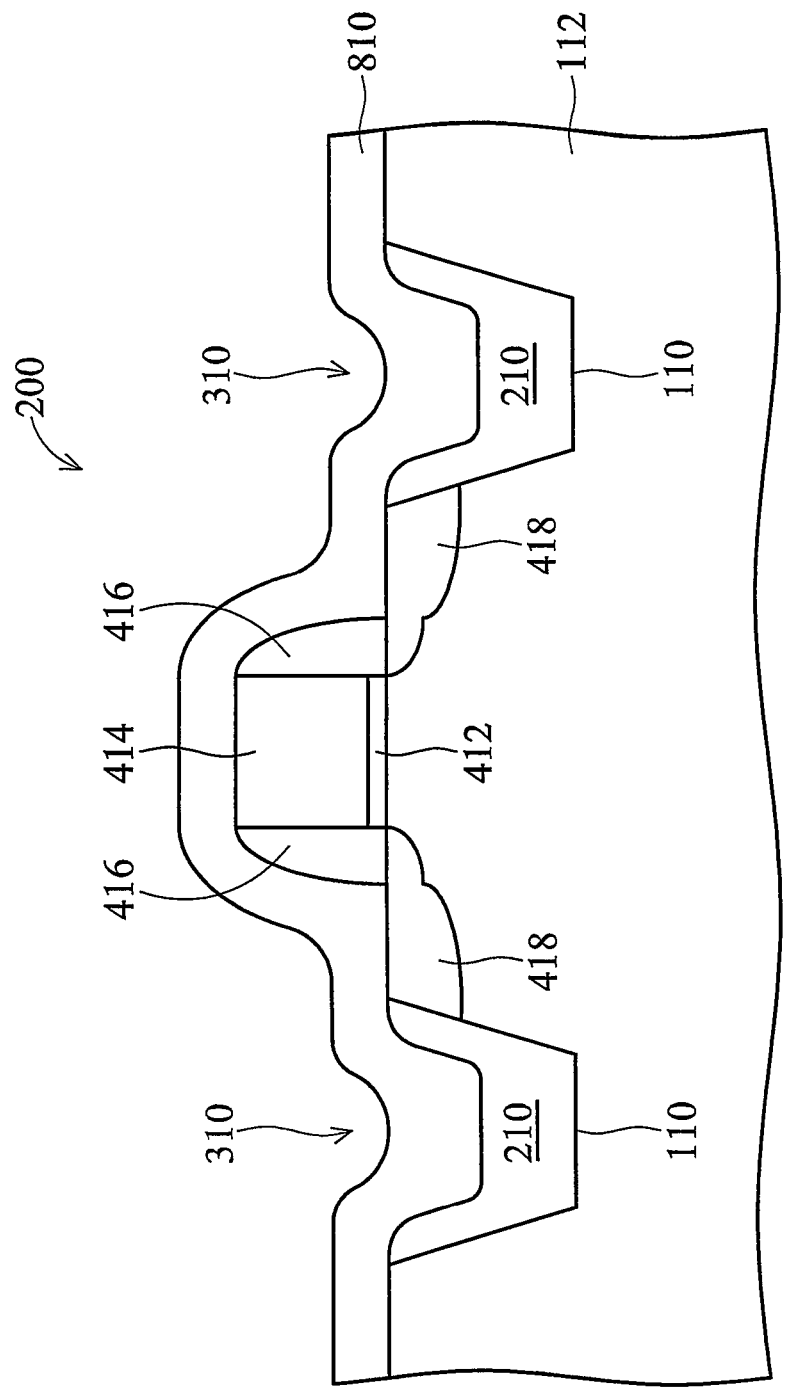

FIGS. 6-8 illustrate another wafer 200 in accordance with an embodiment of the present invention. The wafer 200 of the embodiment illustrated in FIGS. 6-8 assumes a starting device formed, for example, as illustrated above with reference to FIGS. 1-2. Accordingly, the elements having like reference numerals may be formed in a similar manner as described with reference to FIGS. 1-2.

Referring first to FIG. 6, the wafer 200 is shown after the isolation material 210 has been recessed in accordance with an embodiment of the present invention. In this embodiment, however, the isolation material 210 is recessed such that a portion of the isolation material 210 remains along sidewalls of the isolation trench 110 in the recess 310. In this embodiment, the recess 310 may be formed, for example, by photolithography techniques as described above. In this embodiment, a photoresist layer is formed and patterned to expose the isolation material 210 within the isolation trench 110. The isolation material 210 may be recessed by performing a timed dry etch process. For example, in an embodiment in which the isolation material 210 is recessed from about 200 Å to about 500 Å, the isolation material 210 may be recessed by performing a dry etch for about 30 seconds to about 150 seconds. Preferably, the isolation material 210 along the sidewalls of the isolation trench 110 in the recess 310 has a thickness from about 40 Å to about 150 Å.

FIG. 7 illustrates formation of transistor 710 in accordance with an embodiment of the present invention. The transistor 710 may be formed, for example, in a manner similar to the transistor 410 of FIG. 4, wherein like reference numerals refer to like elements. As discussed above, other types and configurations may be used.

FIG. 8 illustrates formation of a high-stress film 810 in accordance with an embodiment of the present invention. The high-stress film 810 may be formed in a manner similar to the high-stress film 510 discussed above with reference to FIG. 5. However, it should be noted that because the isolation material 210 remains along sidewalls of the isolation trench 110, the high-stress film 810 does not directly contact sidewalls of the isolation trenches 110. It has been found that this embodiment transfers significant stress to the channel region of the transistor 710, but may avoid junction leakage issues.

It should also be noted that the processes described above may be performed in a different order. For example, the processes described above recess the isolation material 210 in the isolation trenches 110 prior to forming the gate dielectric 412, the gate electrode 414, and the spacers 416 for illustrative purposes only. In another embodiment, the isolation material 210 is recessed after the gate dielectric 412, the gate electrode 414, and the spacers 416 are formed. In this alternative embodiment, a mask may be applied over the gate electrode 414 and the spacers 416 if necessary to protect the underlying structures during the recess process.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor structure comprising:
a substrate;
an isolation trench formed in the substrate, the isolation trench being at least partially filled with a dielectric material, an entire top surface of the dielectric material in the isolation trench being recessed lower than a top surface of the substrate, the entire top surface of the dielectric material extending between sidewalls of the isolation trench having a planar surface;
a transistor gate over the substrate; and
a contact etch stop layer over the substrate and the dielectric material within the isolation trench in a direction orthogonal to a plane of the top surface of the substrate immediately below the transistor gate, the contact etch stop layer being in direct contact with the substrate along sidewalls of the isolation trench.

2. The semiconductor structure of claim 1, wherein the contact etch stop layer comprises a tensile stress film.

3. The semiconductor structure of claim 1, wherein the contact etch stop layer comprises a compressive stress film.

4. The semiconductor structure of claim 1, wherein the contact etch stop layer covers the transistor gate.

5. The semiconductor structure of claim 1, wherein at least a portion of the dielectric material is recessed from about 200 Å to about 500 Å.

6. A semiconductor structure comprising:
a substrate;
a shallow trench isolation formed in the substrate, the shallow trench isolation comprising a trench at least partially filled with a dielectric material;
a recess in the shallow trench isolation exposing the substrate along a sidewall of the shallow trench isolation, an entire upper surface of the dielectric material being a planar top surface, the planar top surface extending between sidewalls of the shallow trench isolation; and
a contact etch stop layer in the recess and on the substrate, the contact etch stop layer being in direct contact with the substrate along the sidewall and being directly over the dielectric material.

7. The semiconductor structure of claim 6, wherein all of the dielectric material within the shallow trench isolation is recessed below a top surface of the substrate.

8. The semiconductor structure of claim 6, wherein the contact etch stop layer comprises a tensile stress film or a compressive stress film.

9. The semiconductor structure of claim 6, further comprising a transistor on the substrate.

10. The semiconductor structure of claim 9, wherein the contact etch stop layer covers the transistor.

11. The semiconductor structure of claim 6, wherein the recess has a depth of about 200 Å to about 500 Å.

12. A semiconductor structure comprising:
a substrate having a first top side and an opposing first bottom side, the substrate having an isolation trench formed therein on the first top side, the isolation trench being at least partially filled with a dielectric material, an entire upper surface of the dielectric material having a planar top surface lower than an upper corner of the isolation trench;
a transistor gate over the substrate; and
a stress layer over the dielectric material, the transistor gate, and the substrate, the stress layer directly contacting the substrate within the isolation trench, the stress layer comprising a plurality of individual stress layers.

13. The semiconductor structure of claim 12, wherein the stress layer directly contacts an upper portion of the isolation trench.

14. The semiconductor structure of claim 12, wherein the stress layer comprises a tensile stress film or a compressive stress film.

15. The semiconductor structure of claim 12, wherein at least a portion of the top surface of the dielectric material is recessed about 200 Å to about 500 Å below a first surface of the substrate.

16. The semiconductor structure of claim 12, wherein the stress layer covers the transistor gate.

* * * * *